United States Patent
Maeda et al.

(10) Patent No.: US 10,833,477 B2
(45) Date of Patent: Nov. 10, 2020

(54) DRIVE UNIT AND LIGHT-EMITTING DEVICE

(71) Applicant: SONY SEMICONDUCTOR SOLUTIONS CORPORATION, Kanagawa (JP)

(72) Inventors: Osamu Maeda, Miyagi (JP); Masashi Nakamura, Tokyo (JP); Satoru Fushimi, Miyagi (JP); Yuji Furushima, Miyagi (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/464,128

(22) PCT Filed: Nov. 10, 2017

(86) PCT No.: PCT/JP2017/040556
§ 371 (c)(1),
(2) Date: May 24, 2019

(87) PCT Pub. No.: WO2018/096949
PCT Pub. Date: May 31, 2018

(65) Prior Publication Data
US 2019/0296518 A1 Sep. 26, 2019

(30) Foreign Application Priority Data
Nov. 28, 2016 (JP) ................... 2016-230011

(51) Int. Cl.
*H01S 5/042* (2006.01)
*H01S 3/091* (2006.01)
(Continued)

(52) U.S. Cl.
CPC ............. *H01S 5/0428* (2013.01); *G09G 3/02* (2013.01); *H01S 3/0912* (2013.01);
(Continued)

(58) Field of Classification Search
CPC .. H01S 3/094076; H01S 5/062; H01S 3/0912; H01S 5/0261; H01S 5/0428;
(Continued)

(56) References Cited

U.S. PATENT DOCUMENTS 8,619,827 B2 * 12/2013 Maeda ................ H01S 5/06216
372/29.015
2011/0081945 A1 * 4/2011 Rothaar .................... H02J 1/10
455/556.1

(Continued)

FOREIGN PATENT DOCUMENTS

JP 2001-189520 A 7/2001
JP 2011-216662 A 10/2011

(Continued)

OTHER PUBLICATIONS

International Search Report and Written Opinion issued in connection with International Patent Application No. PCT/JP2017/040556 dated Dec. 19, 2017. (8 pages).

*Primary Examiner* — Xinning(Tom) Niu
(74) *Attorney, Agent, or Firm* — K&L Gates LLP

(57) ABSTRACT

In a drive unit according to an embodiment of the present disclosure, in each of a plurality of current pulses, a rising crest value is the largest, and after the rising, the crest value is damped. Further, a rising crest value of a pulse of an n+1-th wave is smaller than a rising crest value of a pulse of an n-th wave. Furthermore, rising crest values of the current pulses of a second wave and waves after the second wave are determined by a mathematical function expressed as an electric potential change caused by ON-OFF of an RC time constant circuit that is single-end grounded. Moreover, in the mathematical function, a time constant at an OFF time is larger than a time constant at an ON time.

2 Claims, 6 Drawing Sheets

(51) Int. Cl.
    *H01S 5/026*     (2006.01)
    *G09G 3/02*     (2006.01)
    *H01S 5/062*     (2006.01)
    *H03K 17/78*     (2006.01)
    *H05B 47/10*     (2020.01)

(52) U.S. Cl.
    CPC ............ *H01S 5/0261* (2013.01); *H01S 5/062* (2013.01); *H03K 17/78* (2013.01); *H05B 47/10* (2020.01); *Y02B 20/42* (2013.01)

(58) Field of Classification Search
    CPC .... H01S 5/06213; H01S 5/068; H01S 5/0427; H05B 47/10; G09G 3/02; H03K 17/78; Y02B 20/42; H04N 9/3129; H04N 9/3155; H04N 9/3182

See application file for complete search history.

(56) References Cited

U.S. PATENT DOCUMENTS

| | | |
|---|---|---|
| 2011/0241571 A1 | 10/2011 | Maeda et al. |
| 2012/0044279 A1 | 2/2012 | Uchino |
| 2014/0105234 A1 | 4/2014 | Maeda et al. |

FOREIGN PATENT DOCUMENTS

| | | |
|---|---|---|
| JP | 2012-148508 A | 8/2012 |
| JP | 2014-075492 A | 4/2014 |
| JP | 5659476 B2 | 1/2015 |
| WO | 2010/125866 A1 | 11/2010 |

\* cited by examiner

[ FIG. 1 ]
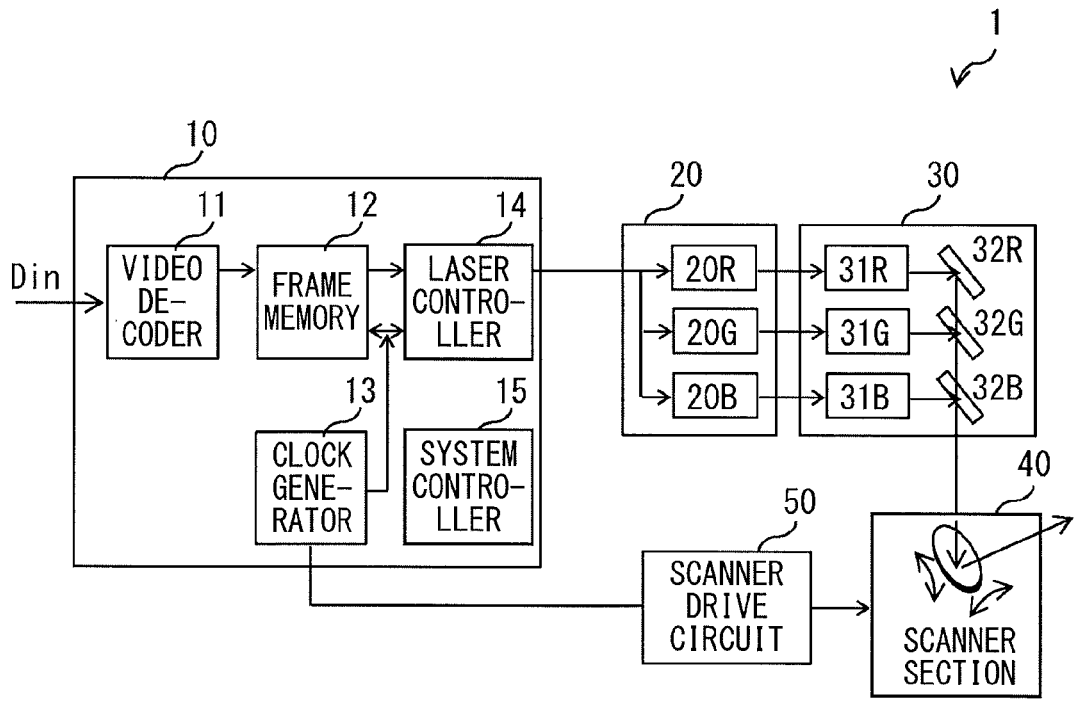
[ FIG. 2 ]
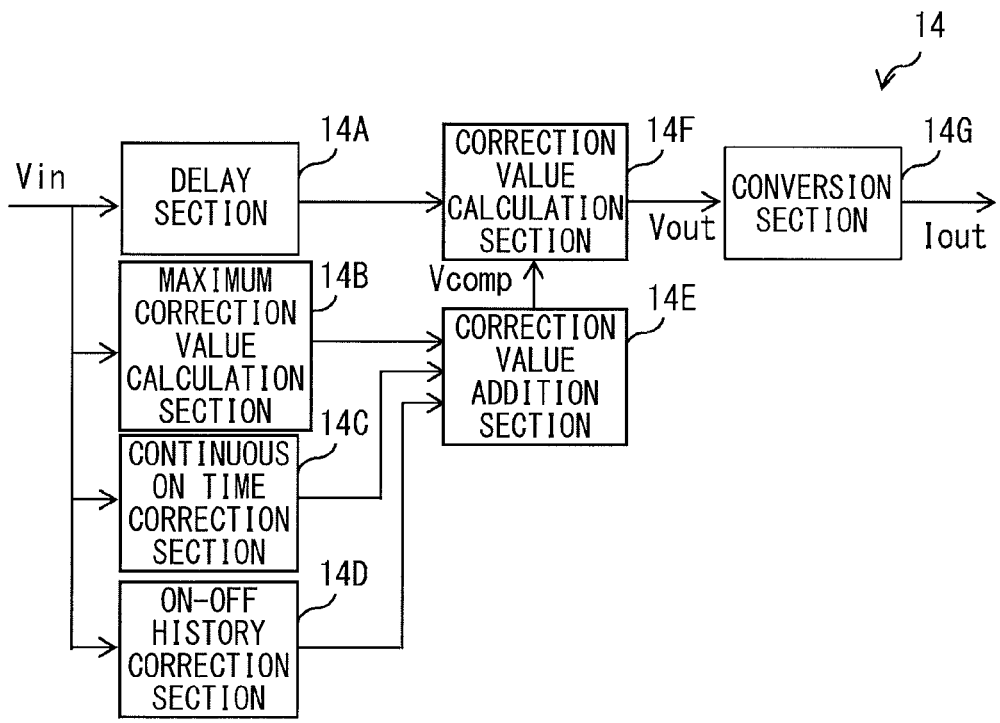

[ FIG. 3 ]
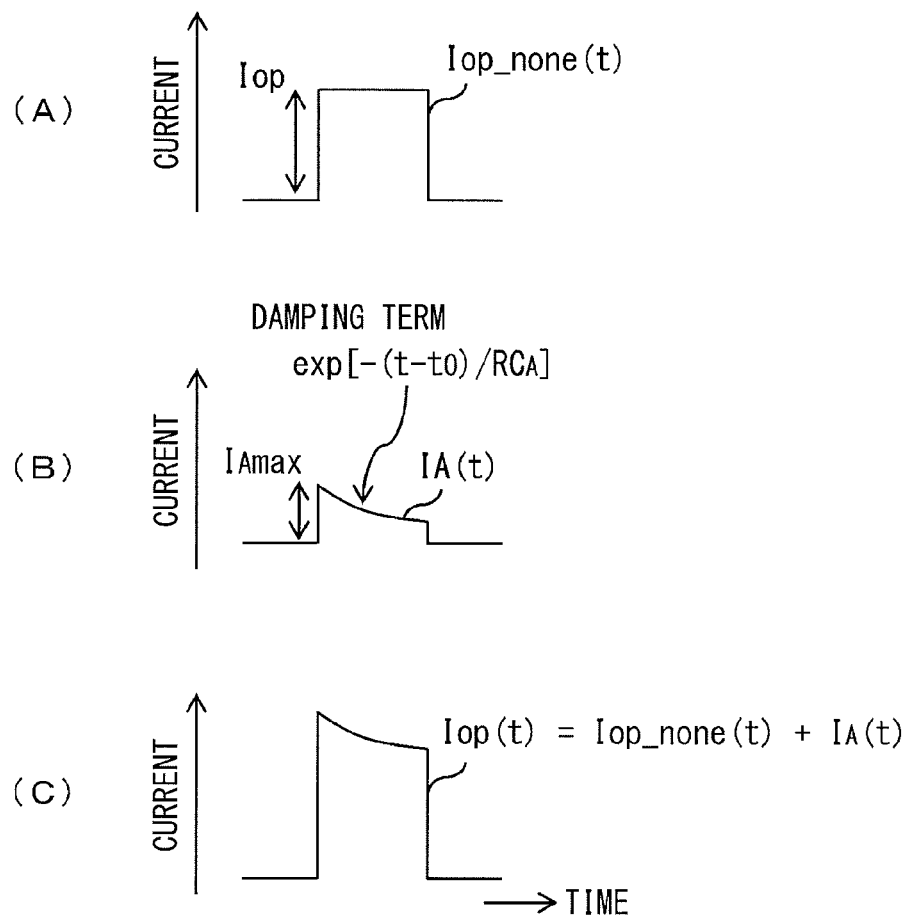
[ FIG. 4 ]
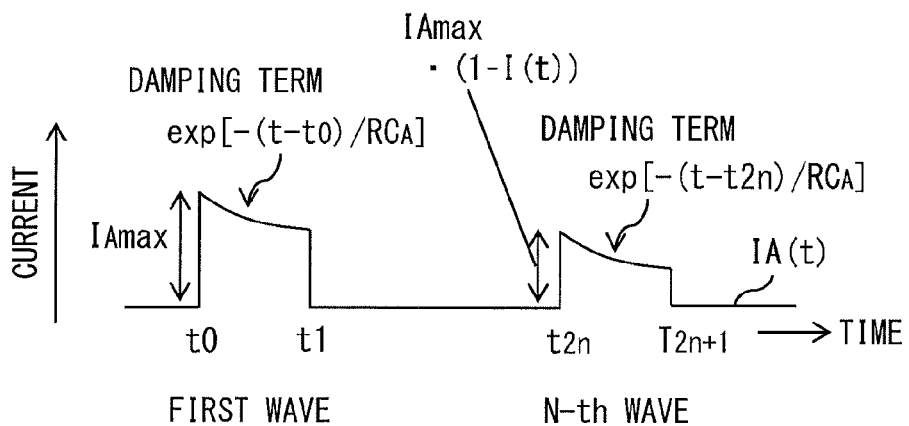

[ FIG. 5 ]
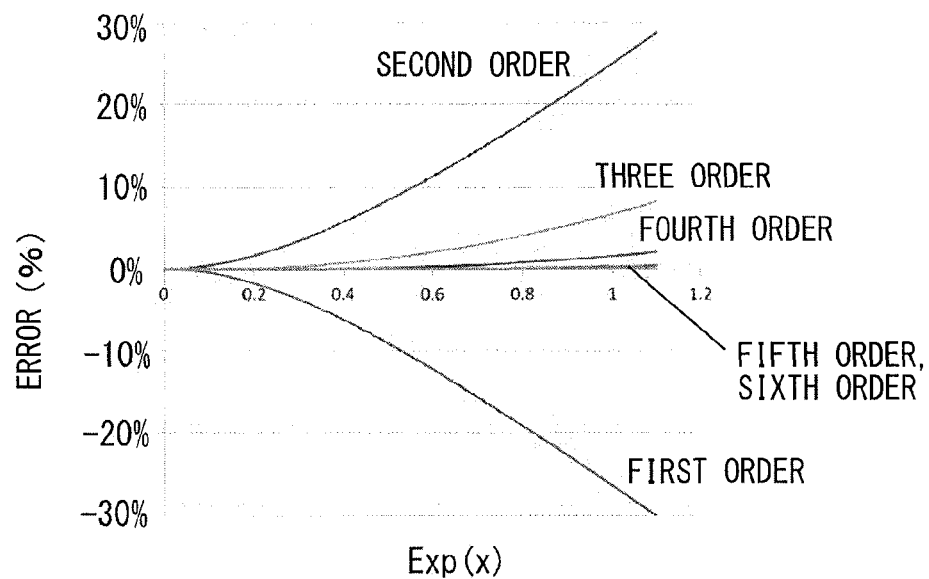
[ FIG. 6 ]
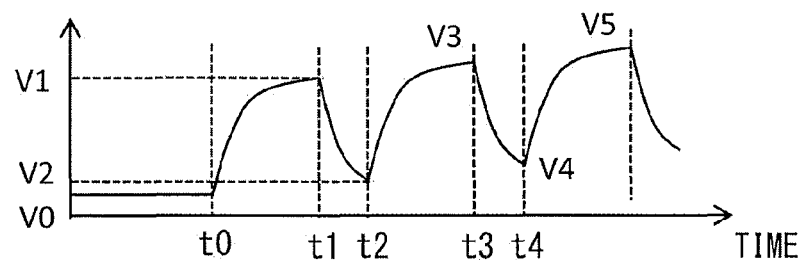

[ FIG. 7 ]
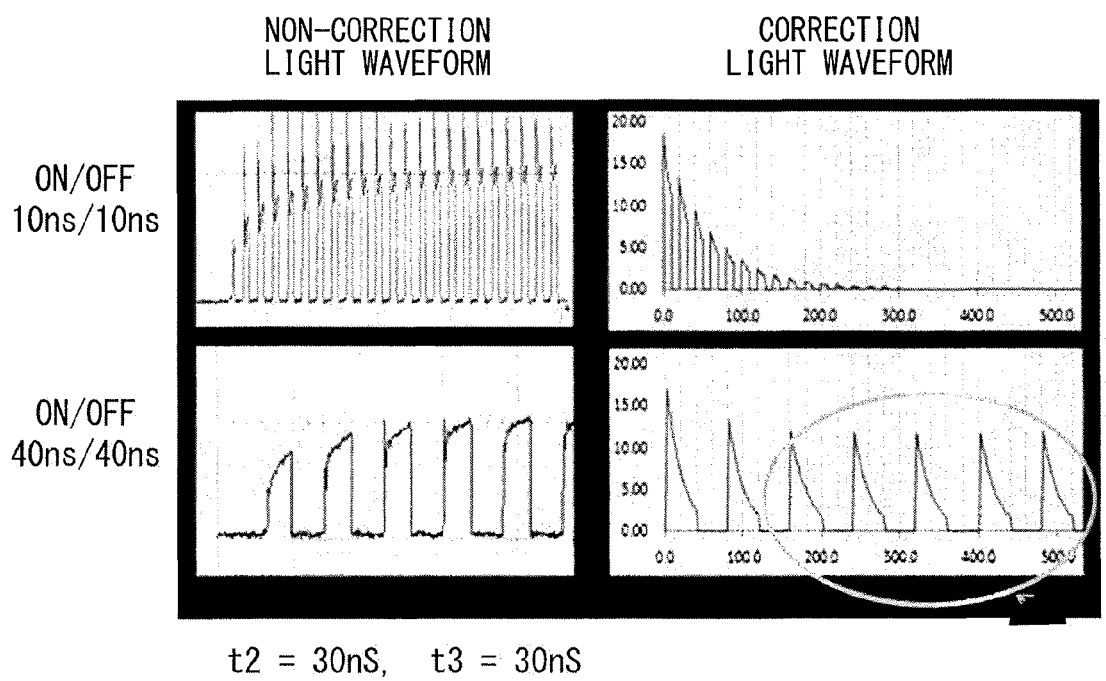
t2 = 30nS,  t3 = 30nS
[ FIG. 8 ]
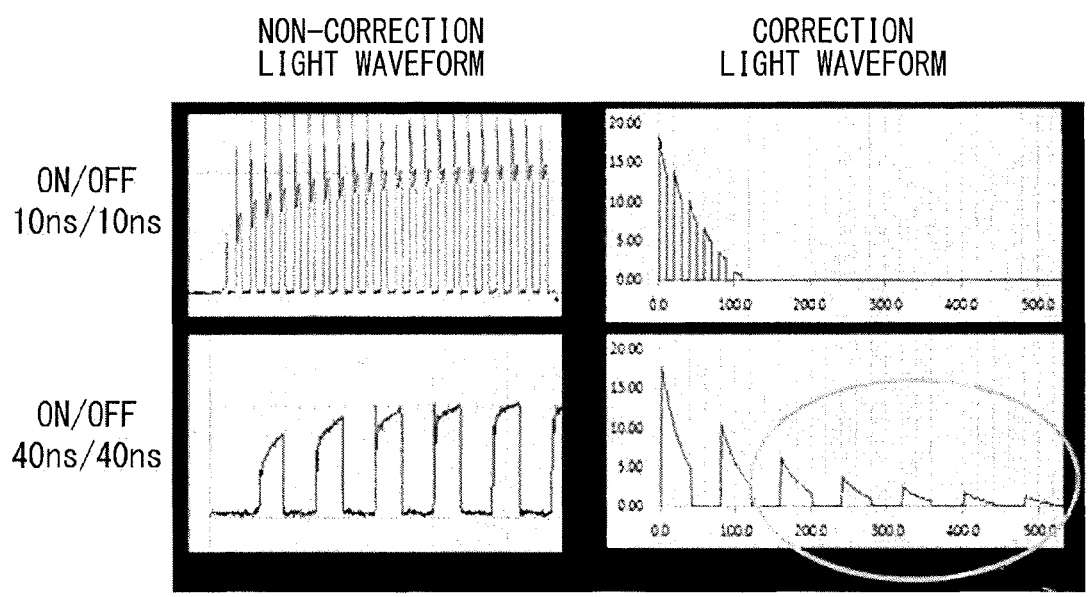
t2 = 30nS,  t3 = 70nS

[ FIG.9 ]
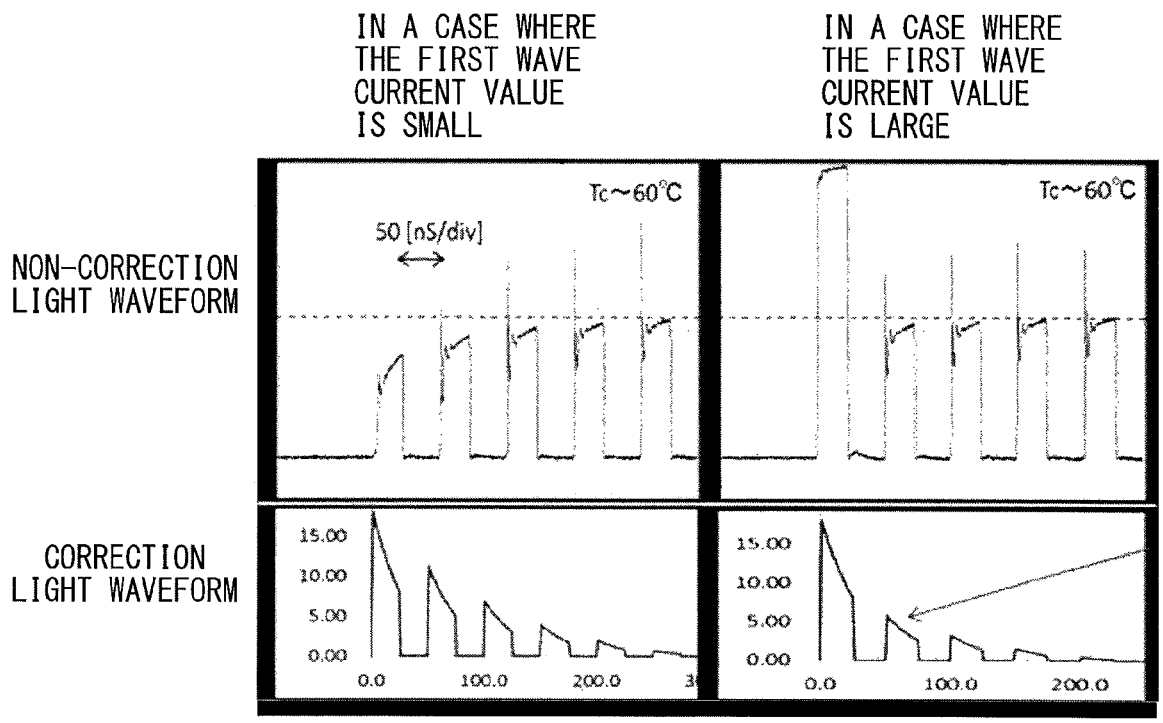

[ FIG. 10 ]
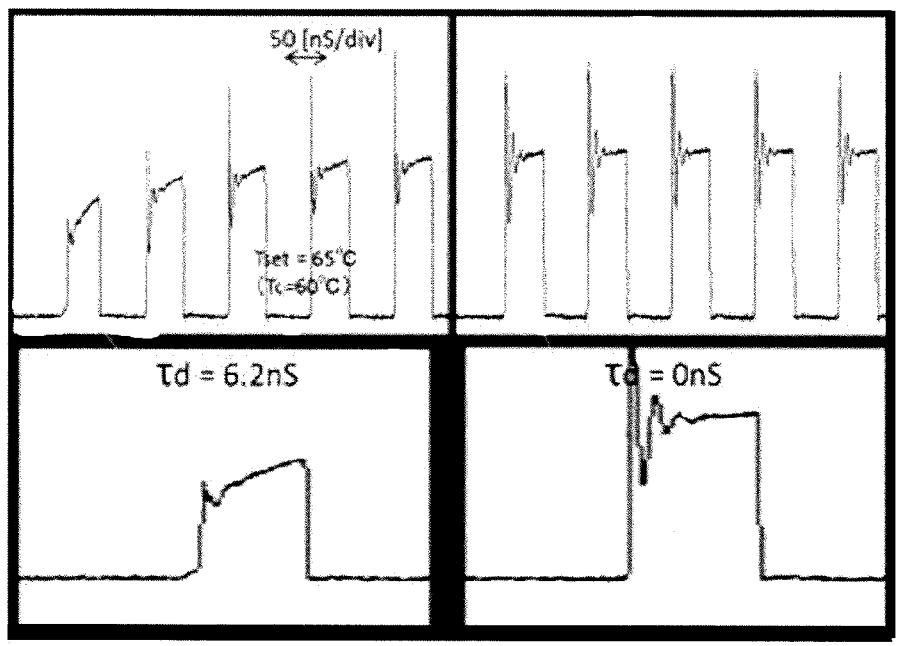
[ FIG. 11 ]
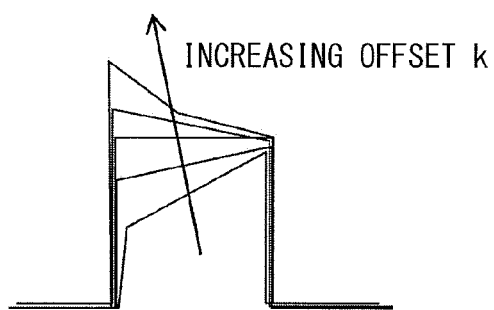

DRIVE UNIT AND LIGHT-EMITTING DEVICE

CROSS-REFERENCE TO RELATED APPLICATIONS

The present application claims the benefit of International Application No. PCT/JP2017/040556, filed Nov. 10, 2017, which claims priority to Japanese Application No. 2016-230011, filed Nov. 28, 2016, the disclosures of which are incorporated herein by reference.

BACKGROUND

The present technology relates to a drive unit and a light-emitting device that control a crest value of a current pulse applied to a semiconductor laser depending on color grayscale.

A technique of stabilizing color grayscale control according to the Pulse Width Modulation (PWM) method is proposed in PTL1 below, for example. In the disclosure of PTL1, a circuit similar to a thermal time-constant circuit of a semiconductor laser is mounted in a laser driver, and an optimal correction current is generated by estimating temperature of an active layer at an optional time.

SUMMARY

However, it is necessary to adopt a different correction method from a correction method disclosed in PTL1 above, upon control of a crest value of a current pulse depending on color grayscale. It is thus desirable to provide a drive unit and a light-emitting device that make it possible to reduce waveform dullness of a light output upon control of a crest value of a current pulse depending on color grayscale.

A drive unit according to an embodiment of the present technology is a drive unit that controls a crest value of a current pulse applied to a semiconductor laser depending on color grayscale. In the drive unit, in each of a plurality of current pulses, a rising crest value is the largest, and after the rising, the crest value is damped. Further, a rising crest value of a pulse of an n+1-th wave is smaller than a rising crest value of a pulse of an n-th wave. Furthermore, rising crest values of the current pulses of a second wave and waves after the second wave are determined by a mathematical function expressed as an electric potential change caused by ON-OFF of an RC time constant circuit that is single-end grounded. Moreover, in the mathematical function, a time constant at an OFF time is larger than a time constant at an ON time.

A light-emitting device according to an embodiment of the present technology includes one or more of semiconductor lasers and the above-described drive unit.

According to the drive unit according to an embodiment and the light-emitting device according to an embodiment of the present technology, the rising crest values of the current pulses of the second wave and the waves after the second wave are determined by the mathematical function expressed as an electric potential change caused by ON-OFF of the RC time constant circuit that is single-end grounded, and, in the mathematical function, the time constant at the OFF time is larger than the time constant at the ON time. It is thus possible to reduce waveform dullness of a light output upon control of the crest value of the current pulse depending on color grayscale. It is to be noted that effects of the disclosure are not necessarily limited to the effects described above, and may be any of the effects described in the specification.

BRIEF DESCRIPTION OF DRAWINGS

FIG. 1 is a diagram illustrating a system configuration example of a projector according to an embodiment of the present technology.

FIG. 2 is a diagram illustrating an example of functional blocks of a laser controller of FIG. 1.

(A) of FIG. 3 illustrates an example of a waveform of a pulse current top none(t) corresponding to an image signal Vin; (B) of FIG. 3 illustrates an example of a waveform of a pulse correction current IA(t) corresponding to an image signal Vcomp; and (C) of FIG. 3 illustrates an example of a waveform of a pulse current Iop(t) corresponding to an image signal Vout.

FIG. 4 illustrates an example of a pulse waveform of an n-th wave in the pulse correction current IA(t).

FIG. 5 illustrates an example of an error for each order in Taylor expansion of a natural logarithm.

FIG. 6 illustrates an example of a voltage change caused by ON-OFF of an RC time constant circuit that is single-end grounded.

FIG. 7 illustrates an example of a non-correction light waveform and an example of a correction current waveform at the time of t2=t3.

FIG. 8 illustrates an example of a non-correction light waveform and an example of a correction current waveform at the time of t2<t3.

FIG. 9 illustrates an example of correction current waveforms when a current value of the first wave is small and when the current value of the first wave is large.

FIG. 10 illustrates an example of a non-correction light waveform and a correction current waveform when a TM mode laser is used.

FIG. 11 illustrates an example of an adjusting method of a correction coefficient.

DETAILED DESCRIPTION

Hereinafter, an embodiment of the present technology is described in detail with reference to drawings.
[Configuration]

Description is given of a projector 1 to which a drive unit according to an embodiment of the present technology is applied. FIG. 1 illustrates a system configuration example of the projector 1 according to the present embodiment. The projector 1 includes a video signal processing circuit 10, a laser drive circuit 20, a light source section 30, a scanner section 40, and a scanner drive circuit 50. The video signal processing circuit 10 and the laser drive circuit 20 correspond to a specific example of a "drive unit" of the present technology.

The video signal processing circuit 10 controls, together with the laser drive circuit 20, a crest value of a current pulse applied to a semiconductor laser depending on color grayscale. The video signal processing circuit 10 includes a video decoder 11, a frame memory 12, a clock generator 13, a laser controller 14, and a system controller 15. The video signal processing circuit 10 is synchronized with scanning operation of the scanner section 40 on the basis of an inputted image signal, and generates an image signal in accordance with a characteristic such as a wavelength of laser light. The image signal for driving such a laser is referred to as a "projection image signal" in the present specification.

The video decoder 11 converts (performs color gamut conversion of) the inputted image signal into an image signal corresponding to a wavelength of each light source of the light source section 30. The frame memory 12 temporarily stores the resultant image signal after the color gamut conversion given from the video decoder 11. The clock generator 13 generates a projection image clock signal that is synchronized with the scanning operation of the scanner section 40. The projection image clock signal is given to the frame memory 12 and the laser controller 14.

The frame memory 12 receives the projection image clock signal, and is thereby synchronized with the projection image clock signal to read the stored image signal. This allows the image signal read from the frame memory 12 to become an image signal that is synchronized with the scanning operation of the scanner section 40. The laser controller 14 generates a projection image signal Tout that allows laser light to be emitted in accordance with the inputted image signal. The laser controller 14 is described in detail later. The system controller 15 is configured by a CPU, etc. and controls the entire system.

The projection image signal generated by the laser controller 14 is supplied to the laser drive circuit 20. Further, the projection image clock signal generated by the clock generator 13 is supplied as necessary to the laser drive circuit 20 from the video signal processing circuit 10. Here, "as necessary" means, for example, a case in which the projection image clock signal is used when a signal source of a high frequency signal is synchronized with an image signal, as descried later.

The laser drive circuit 20 drives each of light sources 31R, 31G, and 31B of the light source section 30 in accordance with the projection image signal Tout corresponding to each wavelength, for example. The laser drive circuit 20 includes, for example, a drive circuit 20R that drives the light source 31R, a drive circuit 20G that drives the light source 31G, and a drive circuit 20B that drives the light source 31B. The light source 31R is a semiconductor laser that outputs red light, for example. The light source 31G is a semiconductor laser that outputs green light, for example. The light source 31B is a semiconductor laser that outputs blue light, for example. The laser drive circuit 20 controls luminance (brightness and darkness) of laser light in order to display an image corresponding to the projection image signal Tout, and modulates intensity of the laser light in order to achieve the grayscale expression.

The light source section 30 includes a plurality of light sources, for example, the three light sources 31R, 31G, and 31B. For the three light sources, laser light sources outputting respective beams of laser light of red (R), green (G), and blue (B) wavelengths are used, for example. The respective beams of laser light outputted from the plurality of light sources 31R, 31G, and 31B are made into substantially parallel light by means of a collimate lens, for example, following which the resultant light is converged into a single beam of laser light by beam splitters 32R, 32G, and 32B, etc. The beam splitter 32R reflects red light, for example. The beam splitter 32G reflects green light, for example, and allows the red light to transmit therethrough. The beam splitter 32B reflects blue light, for example, and allows the red light and the green light to transmit therethrough. The light source section 30 may include a sensor (for example, a photodiode) that detects a light output of laser light outputted to the scanner section 40. In this case, the laser drive circuit 20 may perform Auto Power Control (APC) that corrects the projection image signal Tout on the basis of an output of the sensor.

The laser light that transmits through and is reflected by the beam splitters 32R, 32G, and 32B enters the scanner section 40. The scanner section 40 is configured by one two-axis scanner, for example. The irradiation angle of the incident laser light is modulated by the two-axis scanner in horizontal and vertical directions, following which the resultant laser light is projected on a screen. It is to be noted that the scanner section 40 may have a configuration in which two single-axis scanners are used to perform scanning in the horizontal direction and the vertical direction.

In general, the scanner section 40 includes a sensor that detects an irradiation angle of the two-axis scanner, etc. The sensor outputs an angle signal for each of the horizontal and vertical directions. These angle signals are inputted to the scanner drive circuit 50. The scanner drive circuit 50 drives the scanner section 40 to obtain a desired irradiation angle on the basis of a horizontal angle signal and a vertical angle signal that are inputted from the scanner section 40, for example.

Incidentally, in the projector 1 adopting the laser beam scanning method which is different from the PWM method, a current amount is directly controlled depending on color grayscale upon performing color grayscale control of drawing dots. When dots having the same brightness are drawn at equal intervals, in general, a fixed amount of a pulse current is supplied at equal intervals. However, a light output does not follow the current amount at this occasion, and thus the light output is insufficient at the first of a pulse group. This matter causes a situation in which "an outline of a picture projected on a screen is blurred" or "a picture with small dots is not displayed". To address this, correction processing for solving a "light waveform dullness phenomenon" in which the light output is insufficient at the first of the pulse group is performed in the laser controller 14.

FIG. 2 illustrates an example of functional blocks of the laser controller 14. The laser controller 14 includes a delay section 14A, a maximum correction value calculation section 14B, a continuous ON time correction section 14C, an ON-OFF history correction section 14D, a correction value calculation section 14E, a correction value addition section 14F, and a Video/LD conversion section 14G.

The delay section 14A outputs an image signal Vin inputted from the frame memory 12 to the correction value addition section 14F after a predetermined period of time. The image signal Vin is an image signal corresponding to a rising crest value Iop of a pulse current Iop_none(t) illustrated in (A) of FIG. 3, for example. The image signal is expressed as an 11-bit signal, for example. The maximum correction value calculation section 14B derives a maximum value of a correction amount (a maximum correction value Vcomp_max) for the image signal Vin. The maximum correction value Vcomp_max is an image signal corresponding to a rising crest value IAmax of a pulse correction current IA(t) illustrated in (B) of FIG. 3, for example. A pulse current Iop(t) illustrated in (C) of FIG. 3 is obtained, for example, by adding together the pulse current Iop_none(t) illustrated in (A) of FIG. 3 and the pulse correction current IA(t) illustrated in (B) of FIG. 3. The pulse current Iop(t) corresponds to an example of a pulse current subjected to the correction processing for solving the "light waveform dullness phenomenon". The image signal corresponding to the pulse current Iop(t) is an image signal Vout.

The maximum correction value Vcomp_max is represented, for example, by the following numerical expression (1).

$$\text{Vcomp\_max} = b0\left(a \times Vin + \frac{mT + k}{\text{Slope} \times \text{Max\_Power} \times Lbit}\right) \quad (1)$$

a: slope depending on the image signal Vin (in a range from 0 to 1.000)
b0=slope of the entire maximum correction value Vcomp_max. Adjustment coefficient upon brightness variation, etc. (in a range from 0 to 1.000, default=1)
m: slope of temperature specific correction (in a range from 0 to 1.000)
T: operation temperature (in a range from 0° C. to 60° C.)
k: offset of temperature characteristic correction
Slope: coefficient of slope upon correction with APC (mA/mW)
Max_Power: power when maximizing image signal Vin at power setting (mW)
Lbit: bit length of image signal Vin The continuous ON time correction section 14C derives a correction coefficient Coeff_cnton(t) at a time in a continuous ON state, for the image signal Vin. For example, the correction coefficient Coeff_cnton(t) is a correction coefficient corresponding to a damping term (exp[−(t−to)/RCA]) of the pulse correction current IA(t) illustrated in (B) of FIG. 3. In the pulse correction current IA(t), each pulse is damped by the correction coefficient Coeff_cnton(t). Therefore, for each pulse in the pulse correction current IA(t), a rising crest value is the largest, and after the rising, the crest value is damped. Once the continuous ON time correction section 14C is turned OFF, the correction coefficient Coeff_cnton(t) is reset (to zero). A correction coefficient Coeff_vhist(t) is expressed, for example, by the following numeral expression (2).

$$\text{Coeff\_cnton}(t) = \exp\frac{-\text{ton}}{t1 \times b1} \quad (2)$$

ton: period in which light emission continues after turning ON (for example, the number of counts of a video clock)
t1: time constant of damping (in a range from 0 to 100 nS)
b1: damping amount adjustment coefficient (in a range from 0 to 1.00, default=1)

The ON-OFF history correction section 14D derives the correction coefficient Coeff_vhist(t) that takes into consideration the history of continuous ON-OFFs for the image signal Vin. The ON-OFF history correction section 14D further derives a damping amount of a rising crest value (1−Coeff_vhist(t)) based on the history of continuous ON-OFFs, for the image signal Vin. The damping amount (1−Coeff_vhist(t)) corresponds to a damping amount (1−I(t)) of a rising crest value of a pulse of the n-th wave in the pulse correction current IA(t) illustrated in FIG. 4, for example. The correction coefficient Coeff_vhist(t) is expressed by the following numerical expression (3), for example. The damping amount is expressed by (1−Coeff_vhist(t)). Therefore, a rising crest value of a pulse of the n+1-th wave is found to be smaller than the rising crest value of a pulse of the n-th wave.

$$\text{Coeff\_vhist}(t) = \quad (3)$$
$$\left\{\begin{array}{l} b2\left(\text{Coeff\_vhist\_on(ton)} + Vin\left\{1 - \exp\frac{-\text{ton\_width}}{t2}\right\}\right)_{Vin>0} \\ b2\left(\text{Coeff\_vhist\_off}(toff) \times \exp\frac{-\text{toff\_width}}{t3}\right)_{Vin=0} \end{array}\right\}$$

Coeff_vhist(ton): correction coefficient value at timing of turning ON (Vin>0) from OFF (vin=0)
Coeff_vhist(toff): correction coefficient value at timing of turning OFF from ON
ton: timing of turning ON from OFF
toff: timing of turning OFF from ON
ton width: period in which being ON continues (equal to or larger than 0 and 1000 nm)
toff width: period in which being OFF continues (equal to or larger than 0 and 1000 nm)
t2: time constant of correction coefficient value Coeff_vhist (ton) (in a range from 0 nS to 100 nS, default=30 nS)
t3: time constant of correction coefficient value Coeff_vhist (toff) (in a range from 0 nS to 100 nS, t2<t3, default=70 nS)
b2: damping amount adjustment coefficient (in a range from 0 to 1.50, default=1)

The correction value calculation section 14E derives a correction signal Vcomp(t) for the image signal Vin by using the maximum correction value Vcomp_max, the correction coefficient Coeff_cnton(t), and the correction coefficient Coeff_vhist(t). The correction signal Vcomp(t) is a correction signal corresponding to IA(t) of (C) of FIG. 3 or FIG. 4, for example. The correction signal Vcomp(t) is expressed, for example, by the following numerical expression (4).

$$V\text{comp}(t) = V\text{comp\_max} \times (1 - \text{Ceff\_vhist}(t)) \times \text{Coeff\_cnton}(t) \quad (4)$$

The correction value addition section 14F adds together the image signal Vin inputted from the delay section 14A and the correction signal Vcomp(t) inputted from the correction value calculation section 14E to thereby derive the image signal Vout after correction. The image signal Vout after correction is expressed by the following numerical expression (5), for example. In a case where a value of the image signal Vout exceeds a value of the maximum grayscale, the correction value addition section 14F replaces the value of the image signal Vout with the value of the maximum grayscale.

$$V\text{out} = V\text{in} + V\text{comp}(t) \quad (5)$$

It is to be noted that, when performing Taylor expansion for natural logarithms in the numerical expressions (2) and (3), the order of Taylor expansion is preferably the fifth order or higher. For example, as illustrated in FIG. 5, when the order is the first or second order in Taylor expansion of a natural logarithm, the accuracy is very poor. When the order is the third or fourth order, the accuracy is somewhat poor. However, when the order is the fifth or sixth order in Taylor expansion of the natural logarithm, the accuracy is very high.

The Video/LD conversion section 14G converts the image signal Vout obtained by the correction value addition section 14F into a signal (the projection image signal Iout) that is suitable for inputting to the laser drive circuit 20 that controls a light output depending on a crest value.

(Regarding Correction Coefficient Coeff_vhist(t))

A mathematical function expressing a light emission history is a mathematical function that determines correction current values of the second wave and waves after the second wave (rising crest values of current pulses). The mathematical function expressing the light emission history is expressed by Coeff_vhist(t), for example, and follows the time constants represented by t2 and t3 in the numerical expression (3). The mathematical function expressing the light emission history is expressed as a voltage change caused by ON-OFF of the RC time constant circuit that is single-end grounded. More specifically, the mathematical function expressing the light emission history is expressed as a voltage change due to a fluctuation of an electric charge that is stored in a capacitance when the RC time constant circuit having Vo[V] at a single end is fed with a current at the other end thereof (for example refer to FIG. 6). However, what is characteristic here is that the RC time constant differs between an ON time and an OFF time. In order to feed an optimal correction current for any pulse pattern, it is necessary to set the time constant at the OFF Time (t3) to be larger than the time constant at the ON time (t2). It is preferable to have the time constant at the ON time (t2)=30 nS and the time constant at the OFF time (t3)=70 nS.

(Reason for t2<t3)

It is satisfactory that a thermal time constant of a laser element is t2=t3 when the present light waveform dullness phenomenon is caused simply by a thermal phenomenon. However, the behavior of this phenomenon attributes to complex factors of temperature and carrier lifetime of the laser element. Therefore, it is necessary to change the time constant between the ON time and the OFF time. For example, FIG. 7 illustrates shapes of correction current waveforms when t2 and t3 are different from each other. As illustrated in FIG. 7, a correction current generated by the time constant circuit of t2=t3=30 nS seems to output a proper correction current for a repetitive pulse that switches between ON and OFF every 10 ns. However, in a repetitive pulse that switches between the ON and the OFF every 40 ns, it is highly likely that a convergence deteriorates in the latter half of the pulse and excessive correction occurs (a portion enclosed by a circle illustrated in FIG. 7). In contrast, as illustrated in FIG. 8, a correction current waveform generated by the time constant circuit of t2=30 nS and t3=70 nS is a proper correction current for any pattern (a portion enclosed by a circle illustrated in FIG. 8).

(Case of Pulse Current Amount Intermittently Changing)

In a case where a pulse current amount is constant, when t2<t3 holds true in the numerical expression (3), it is possible to feed an optimal correction current. In contrast, in a case where the pulse current amount intermittently changes, it is necessary to slightly modify the correction expression. In a case where the first wave current is large as illustrated in the upper-right diagram of FIG. 9, the light waveform dullness of each of the second wave and waves after the second wave is reduced. Thus, it is necessary to set a correction current amount to be also smaller accordingly for each of the second wave and the waves after the second wave, as indicated by an arrow illustrated in the lower-right graph of FIG. 9. There is a possibility that a correction current may diverge when a numerical expression that expresses this is converted to a numerical expression of a simple thermal time constant. Therefore, the following numerical expression (6) instead of the numerical expression (3) is used. b3 is a constant. In the numerical expression (6), when a current amount is large, 1/(a×Vin+b3) is applied as a coefficient of the time constant t2. Therefore, a visible time constant is made smaller, and it is possible to make subsequent correction current amounts smaller. It is to be noted that b3 is a constant.

$$\text{Coeff\_vhist}(t) = \tag{6}$$

$$\left\{ \begin{array}{l} b2\left(\text{Coeff\_vhist\_on(ton)} + Vin\left\{1 - \exp\dfrac{-\text{ton\_width}}{t2 \times \dfrac{1}{a \times Vin + b3}}\right\}\right)_{Vin>0} \\ b2\left(\text{Coeff\_vhist\_off}(toff) \times \exp\dfrac{-\text{toff\_width}}{t3}\right)_{Vin=0} \end{array} \right\}$$

(TM Mode Laser)

By making OH small, a TM mode laser becomes advantageous for high output. However, at the same time, for example, oscillation delay and pulse waveform dullness occur as illustrated in the left graph of FIG. 10. At this occasion, in a case where the TM mode laser is used for the light source section 30, the oscillation delay and the pulse waveform dullness are reduced by the above-described current correction, as illustrated in the right graph of the FIG. 10, for example. Accordingly, even in a case where high-speed optical modulation is performed in the TM mode laser, the oscillation delay and the pulse waveform dullness are reduced by the above-described current correction.

(Method of Adjusting Correction Amount (Example))

For example, as illustrated in FIG. 11, a correction amount may be adjusted by monitoring light outputs while intermittently changing a numerical value of an offset k, for the maximum correction value Vcomp_max of a correction pulse current in which the duty ratio is fixed to a predetermined value d. For example, there is timing of pulse light output/d=light output upon DC, when increasing the offset k intermittently. At this occasion, the pulse waveform approximates a rectangular wave and exhibits optimal grayscale controllability. Accordingly, adjustment of the correction amount is optimized by searching for the offset k when satisfying light output upon DC=pulse light output/d.

[Operation]

In the projector 1 with such a configuration, a rectangular current pulse is outputted from the laser drive circuit 20. At this occasion, in the video signal processing circuit 10, the maximum value of a correction amount (the maximum correction value Vcomp_max) for the image signal Vin is derived by using the above-described numerical expression (1). Further, in the video signal processing circuit 10, the correction coefficient Coeff_cnton(t) at a time in the continuous ON state for the image signal Vin is derived by using the above-described numerical expression (2). Furthermore, in the video signal processing circuit 10, the correction coefficient Coeff_vhist(t) that takes into consideration the history of continuous ON-OFFs for the image signal Vin is derived by using the above-described numerical expression (3). Moreover, in the video signal processing circuit 10, the correction signal Vcomp(t) for the image signal Vin is derived by using the above-described numerical expression (4), and further the image signal Vout after correction is derived by using the above-described numerical expression (5). In addition, in the video signal processing circuit 10, the image signal Vout after correction is converted to the projection image signal Tout. This causes the projection image signal Tout to be inputted to the laser drive circuit 20, thereby causing a rectangular current pulse to be outputted from the laser drive circuit 20.

[Effects]

Next, description is given of effects of the projector 1 according to the present embodiment.

A technique of stabilizing color grayscale control according to the PWM method is proposed in the above-listed PTL1, for example. In the disclosure of PTL1, a circuit similar to a thermal time-constant circuit of a semiconductor laser is mounted in a laser driver, and an optimal correction current is generated by estimating temperature of an active layer at an optional time. However, it is necessary to adopt a different correction method from the correction method disclosed in PTL1 above, upon control of a crest value of a current pulse depending on color grayscale.

Accordingly, in the present embodiment, the rising crest values of the current pulses of the second wave and waves after the second wave are determined by the mathematical function expressed as an electric potential change caused by ON-OFF of the RC time constant circuit that is single-end grounded. Further, in this mathematical function, a time constant at the OFF time is larger than a time constant at the ON time. This makes it possible to reduce waveform dullness of a light output upon control of the crest value of the current pulse depending on color grayscale.

Further, in the present embodiment, in a case where a current amount of a current pulse intermittently changes, a visible time constant at the ON time is made smaller by multiplying the time constant at the ON time by a coefficient that is smaller than 1. This makes it possible to reduce waveform dullness of a light output upon control of the crest value of the current pulse depending on color grayscale even in a case where the current amount of the current pulse intermittently changes.

Although the description has been given hereinabove of the present technology with reference to the embodiment, the present technology is not limited to the above-described embodiment, but may be modified in a variety of ways. It is to be noted that effects described herein are mere examples. Effects of the present technology are not limited to the effects described herein. The present technology may include other effects than the effects described herein.

For example, it is of course possible to apply the video signal processing circuit 10 of the above-described embodiment to a display apparatus other than the projector 1. However, in such a case, it may not be necessary to cause the clock generator 13 to cooperate with the scanner drive circuit 50. In addition, in the above-described embodiment, the signal correction by the laser controller 14 may be performed for all of the light sources 31R, 31G, and 31B included in the light source section 30, or may be performed for only the light source 31R.

Moreover, for example, the present technology may have the following configurations.

(1)

A drive unit configured to control a crest value of a current pulse applied to a semiconductor laser depending on color grayscale, in which in each of a plurality of the current pulses, a rising crest value is largest, and after the rising, the crest value is damped, a rising crest value of a pulse of an n+1-th wave is smaller than a rising crest value of a pulse of an n-th wave, rising crest values of the current pulses of a second wave and waves after the second wave are determined by a mathematical function expressed as an electric potential change caused by ON-OFF of an RC time constant circuit that is single-end grounded, and in the mathematical function, a time constant at an OFF time is larger than a time constant at an ON time.

(2)

The drive circuit according to (1), in which, in a case where a current amount of the current pulse intermittently changes, a visible time constant at the ON time is made smaller by multiplying the time constant at the ON time by a coefficient that is smaller than 1.

(3)

A light-emitting device including:

one or more of semiconductor lasers; and a drive unit configured to control a crest value of a current pulse applied to the semiconductor laser depending on color grayscale, in which, in the drive unit, in each of a plurality of the current pulses, a rising crest value is largest, and after the rising, the crest value is damped, a rising crest value of a pulse of an n+1-th wave is smaller than a rising crest value of a pulse of an n-th wave, rising crest values of the current pulses of a second wave and waves after the second wave are determined by a mathematical function expressed as an electric potential change caused by ON-OFF of an RC time constant circuit that is single-end grounded, and in the mathematical function, a time constant at an OFF time is larger than a time constant at an ON time.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A drive unit configured to control a crest value of a current pulse applied to a semiconductor laser depending on color grayscale, wherein in each of a plurality of the current pulses, a rising crest value is largest, and after the rising, the crest value is damped, a rising crest value of a pulse of an n+1-th wave is smaller than a rising crest value of a pulse of an n-th wave, rising crest values of the current pulses of a second wave and waves after the second wave are determined by a mathematical function expressed as an electric potential change caused by ON-OFF of an RC time constant circuit that is single-end grounded, and in the mathematical function, a time constant at an OFF time is larger than a time constant at an ON time, and wherein, in a case where a current amount of the current pulse intermittently changes, a visible time constant at the ON time is made smaller by multiplying the time constant at the ON time by a coefficient that is smaller than 1.

2. A light-emitting device comprising:

one or more of semiconductor lasers; and a drive unit configured to control a crest value of a current pulse applied to the one or more of semiconductor lasers depending on color grayscale, wherein, in the drive unit, in each of a plurality of the current pulses, a rising crest value is largest, and after the rising, the crest value is damped, a rising crest value of a pulse of an n+1-th wave is smaller than a rising crest value of a pulse of an n-th wave, rising crest values of the current pulses of a second wave and waves after the second wave are determined by a mathematical function expressed as an electric potential change caused by ON-OFF of an RC time constant circuit that is single-end grounded, and in the mathematical function, a time constant at an OFF time is larger than a time constant at an ON time, and wherein, in a case where a current amount of the current pulse intermittently changes, a visible time constant at the ON time is made smaller by multiplying the time constant at the ON time by a coefficient that is smaller than 1.

* * * * *